US009911637B2

(12) United States Patent
Katsuragawa et al.

(10) Patent No.: US 9,911,637 B2
(45) Date of Patent: Mar. 6, 2018

(54) OVERLAPPING DEVICE, AND OVERLAPPING METHOD

(71) Applicant: Tokyo Ohka Kogyo Co., Ltd., Kawasaki-shi (JP)

(72) Inventors: Junichi Katsuragawa, Kawasaki (JP); Satoshi Kobari, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/409,137

(22) PCT Filed: Apr. 30, 2013

(86) PCT No.: PCT/JP2013/062572
§ 371 (c)(1),
(2) Date: Dec. 18, 2014

(87) PCT Pub. No.: WO2014/002609
PCT Pub. Date: Jan. 3, 2014

(65) Prior Publication Data
US 2015/0194329 A1 Jul. 9, 2015

(30) Foreign Application Priority Data

Jun. 25, 2012 (JP) .................. 2012-142389

(51) Int. Cl.
G06K 9/00 (2006.01)
H01L 21/68 (2006.01)
(Continued)

(52) U.S. Cl.
CPC .......... *H01L 21/681* (2013.01); *G06T 7/0004* (2013.01); *G06T 11/60* (2013.01);
(Continued)

(58) Field of Classification Search
None
See application file for complete search history.

(56) References Cited

U.S. PATENT DOCUMENTS 8,060,330 B2   11/2011 O'Neill et al.
2007/0125495 A1*  6/2007 Nakamura .......... B32B 38/1841
                                                  156/382

(Continued)

FOREIGN PATENT DOCUMENTS

JP   2006245279   9/2006
JP   2007158122   6/2007
(Continued)

OTHER PUBLICATIONS

Office Action in Taiwanese Patent Application No. 102117205, dated May 29, 2015.
(Continued)

*Primary Examiner* — Fred Hu
(74) *Attorney, Agent, or Firm* — Knobbe, Martens, Olson & Bear, LLP

(57) ABSTRACT

An overlapping device which is configured to detect the center positions of a substrate and a support which are held in a center position detecting portion, carry the substrate and the support from the center position detecting portion to an overlapping portion, and overlap the substrate and the support such that the detected center positions of the substrate and the support are overlapped in the overlapping portion.

6 Claims, 6 Drawing Sheets

(51) Int. Cl.
*G06T 7/00* (2017.01)
*G06T 11/60* (2006.01)
*H01L 21/683* (2006.01)
*H01L 21/687* (2006.01)

(52) U.S. Cl.
CPC .......... *H01L 21/68* (2013.01); *H01L 21/6835* (2013.01); *H01L 21/6836* (2013.01); *H01L 21/68785* (2013.01); *G06T 2207/30108* (2013.01); *H01L 2221/6834* (2013.01); *H01L 2221/68318* (2013.01); *H01L 2221/68327* (2013.01); *H01L 2221/68331* (2013.01); *H01L 2221/68381* (2013.01)

(56) References Cited

U.S. PATENT DOCUMENTS

| | | | |
|---|---|---|---|
| 2008/0181752 A1* | 7/2008 | Takahashi | H01L 21/681 414/222.02 |
| 2010/0150695 A1 | 6/2010 | O'Neill et al. | |
| 2010/0206454 A1* | 8/2010 | Maeda | H01L 21/67092 156/60 |
| 2012/0132359 A1 | 5/2012 | Nakamura et al. | |
| 2013/0157438 A1 | 6/2013 | Maeda et al. | |
| 2013/0195587 A1* | 8/2013 | Hosaka | H01L 21/6773 414/222.13 |

FOREIGN PATENT DOCUMENTS

| | | |
|---|---|---|
| JP | 2008-182127 | 8/2008 |
| JP | 2011-181755 | 9/2011 |
| JP | 2012-059758 | 3/2012 |
| JP | 2012059758 A * | 3/2012 |
| JP | 2013-33809 A * | 2/2013 |
| TW | 201029101 A | 8/2010 |
| WO | WO 2009/057710 | 5/2009 |

OTHER PUBLICATIONS

International Search Report issued in PCT/JP2013/062572 dated May 28, 2013.

Office Action in Japanese Patent Application No. 2012-142389 dated Apr. 12, 2016.

* cited by examiner

[FIG. 1]
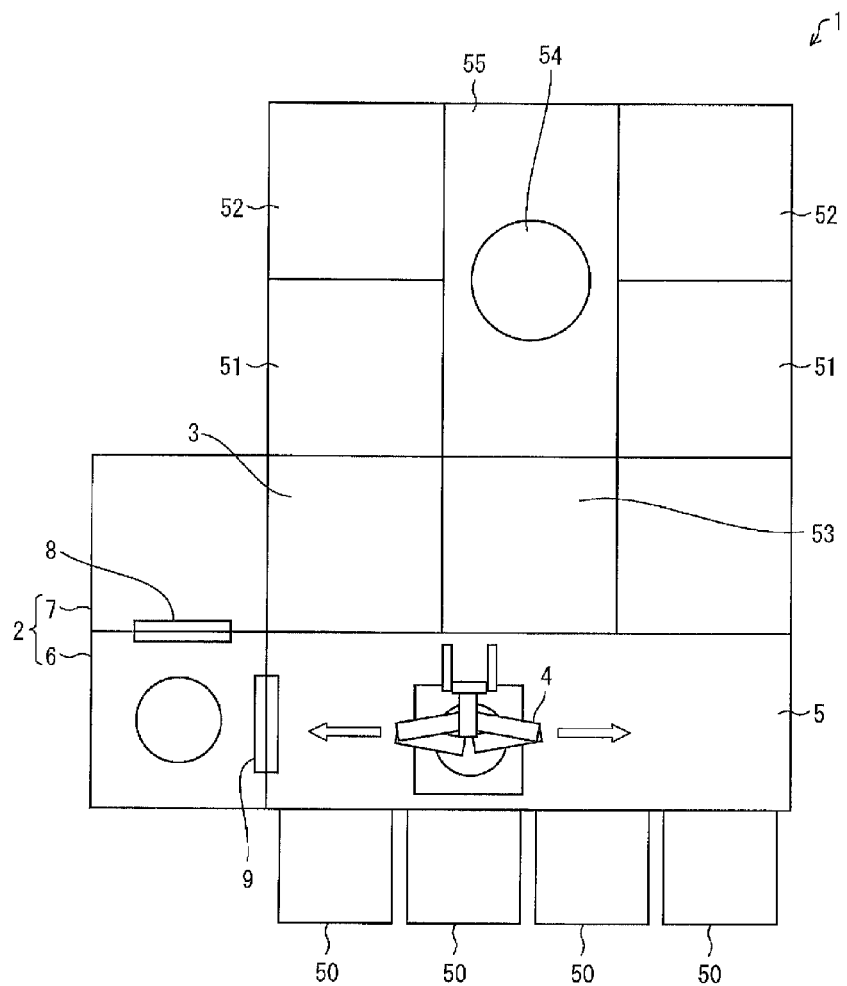

[FIG. 2]
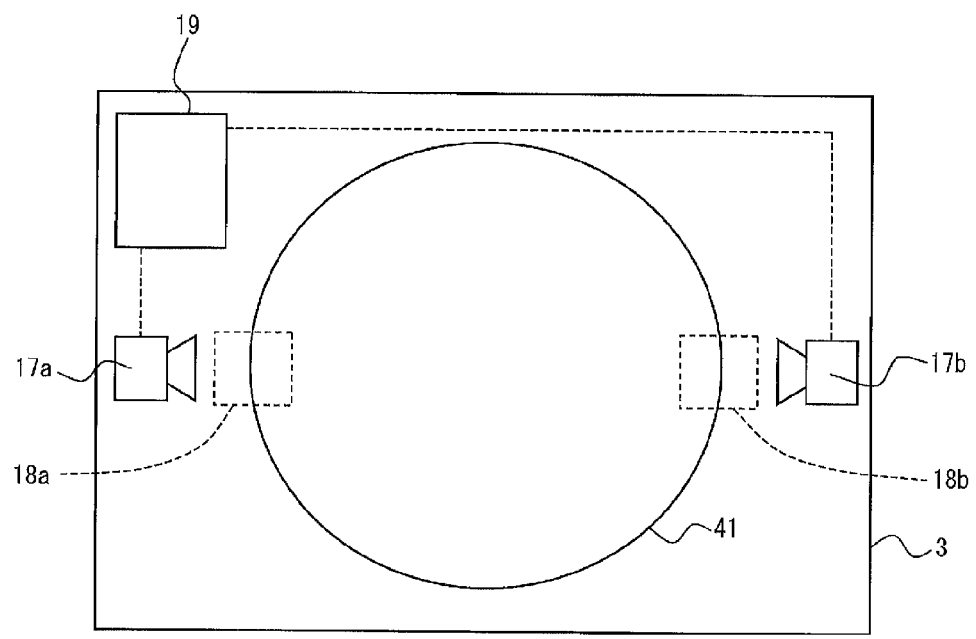

[FIG. 3]
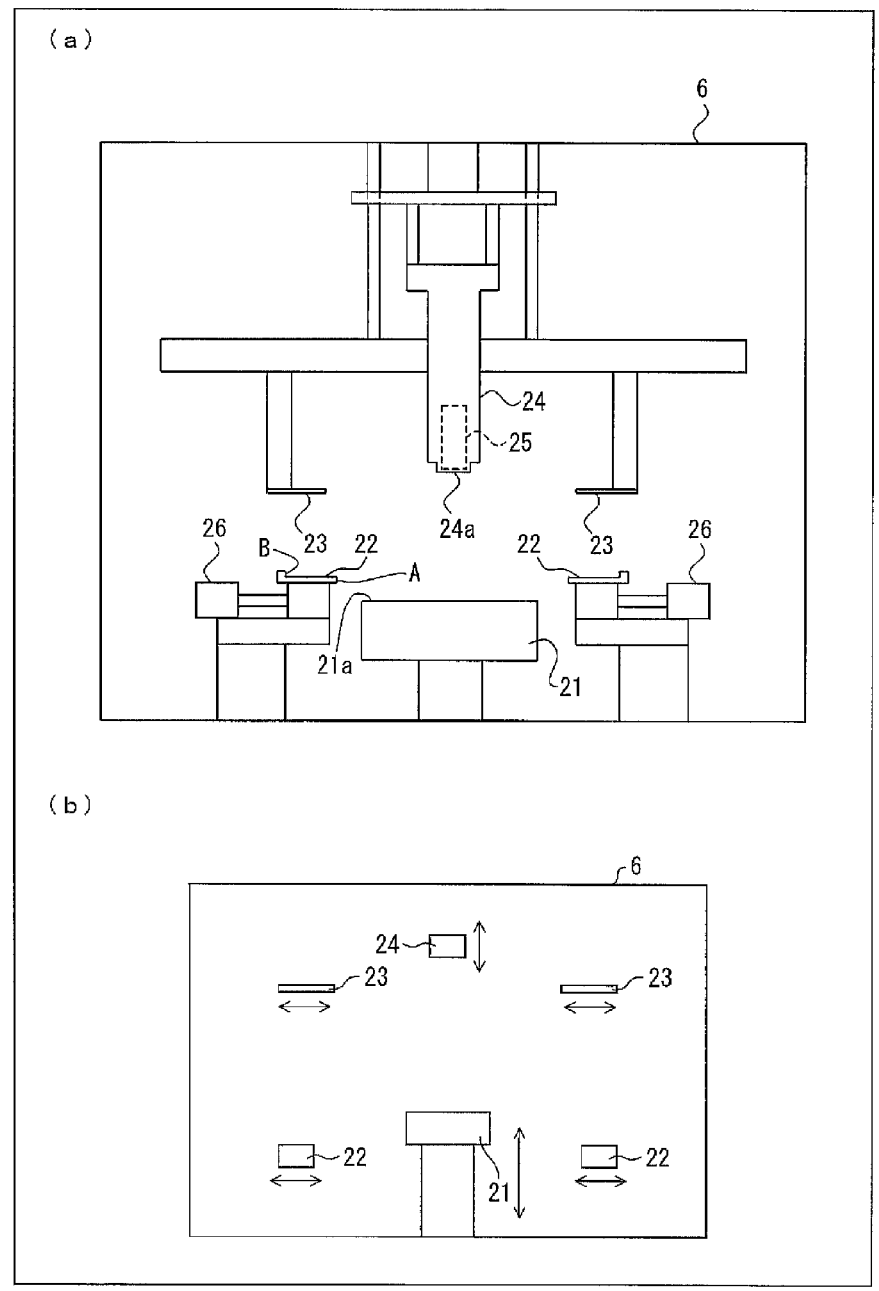

[FIG. 4]
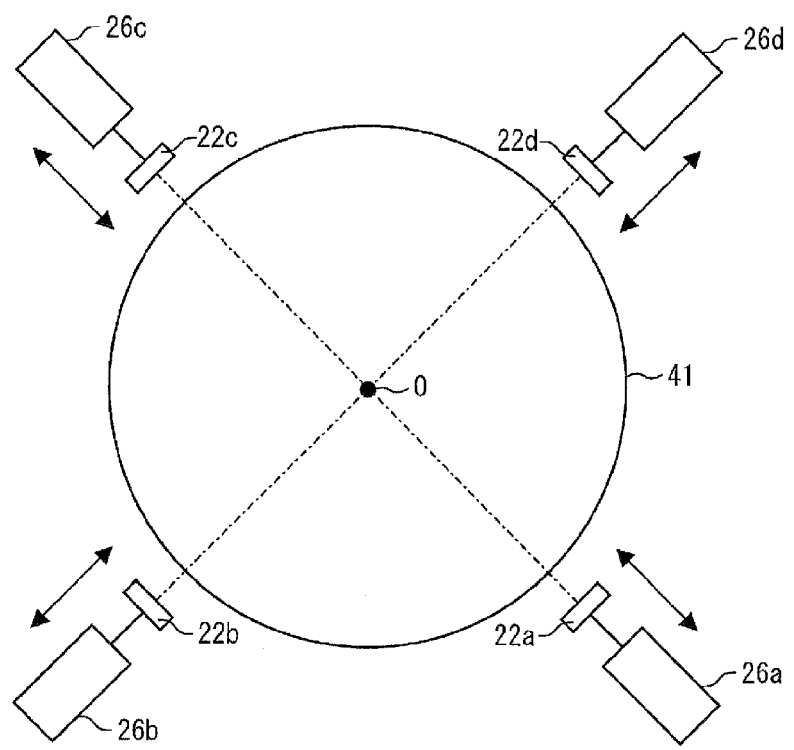

[FIG. 5]
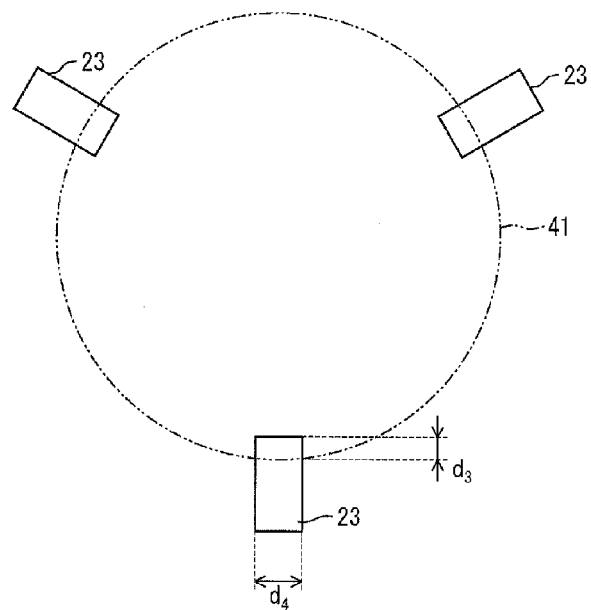
[FIG. 6]
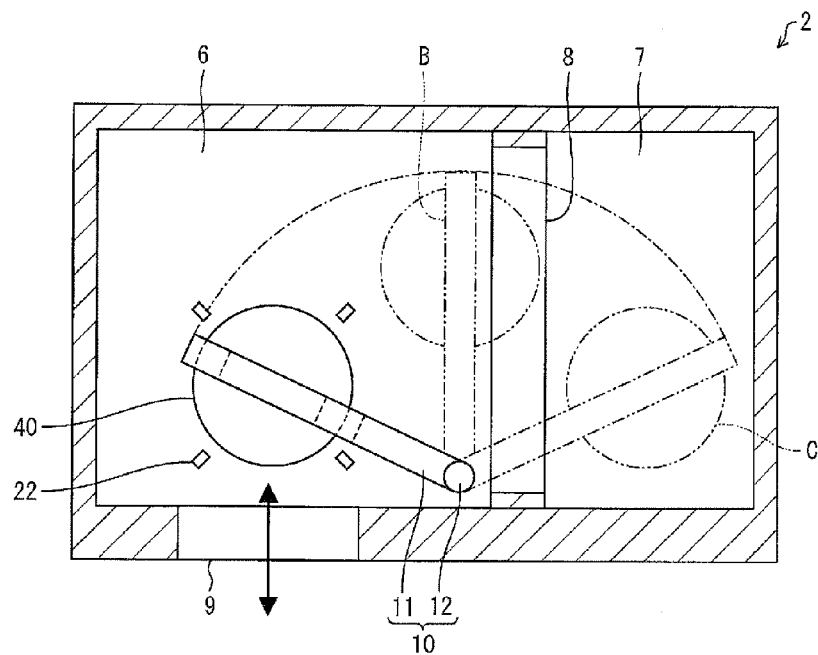

[FIG. 7]
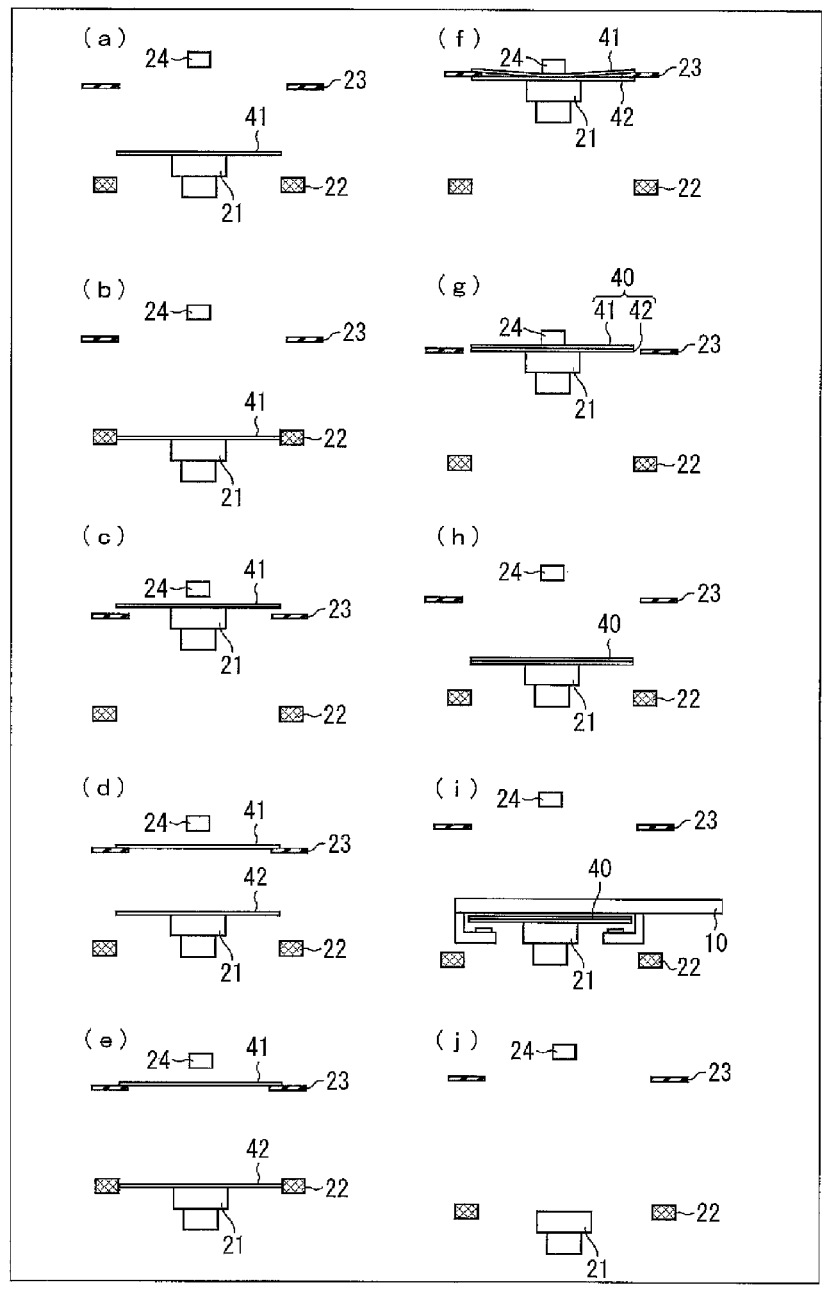

OVERLAPPING DEVICE, AND OVERLAPPING METHOD

This application is the U.S. National Phase under 35 U.S.C. § 371 of International Application No. PCT/JP2013/062572, filed Apr. 30, 2013, designating the U.S., and published in Japanese as WO 2014/002609 on Jan. 3, 2014, which claims priority to Japanese Patent Application No. 2012-142389, filed Jun. 25, 2012, the entire contents of which is incorporated herein by reference.

TECHNICAL FIELD

The present invention relates to an overlapping device and an overlapping method for overlapping a substrate and a support.

BACKGROUND ART

Products such as a mobile telephone, digital AV equipment, and an IC card have been improved to have more sophisticated functions. This gives rise to an increase in the demand that semiconductor silicon chips (hereinafter, referred to as chips) provided in the products are downsized and thinned so that chips can be provided with higher density in a package. In order to provide the chips with higher density in the package, it is necessary to thin the chips to a thickness in a range of 25 µm to 150 µm.

By a grinding process, semiconductor wafers (hereinafter, referred to as wafers) which serve as bases for the respective chips are thinned. However, this weakens the strength, and cracks or warpages are likely to be formed in the wafer. In addition, the wafers weakened in strength through the thinning have difficulty being carried automatically and need to be carried manually. As can be understood from this, handling of the wafers is troublesome.

For this reason, a wafer support system is developed which holds strengths of the wafers and prevents the wafers from being cracked or warped by bonding a plate called a support plate, which is made from glass or hard plastic, to the wafers to be thinned. Because the strength of the wafers can be secured by the wafer support system, it is possible to automatically carry the semiconductor wafers after the thinning process.

The wafers and the support plates are bonded to each other by use of an adhesive tape, a thermoplastic resin, an adhesive, or the like. The wafers to which the support plate is attached are thinned. After that, the support plate is peeled off from a substrate before the wafers are diced.

Here, PTL 1 and PTL 2 disclose technology in which when bonding a support plate to a wafer, first, the wafer and the support plate are overlapped in a state in which the alignment of the wafer and the support plate is performed using an overlapping device, and the overlapped wafer and support plate are carried to an attaching apparatus and bonded.

CITATION LIST

Patent Literature

JP-A-2008-182127 (published in Aug. 7, 2008)
JP-A-2012-059758 (published in Sep. 17, 2012)

SUMMARY OF INVENTION

Technical Problem

However, in the related art, the overlapping device is configured to match the outer diameters of a wafer and a support plate. In general, a support plate has variation in size in many cases, and in a case of matching the outer diameters of a wafer and a support plate, there is a possibility that due to the variation, variation in the relative position of the wafer and the support plate also occurs. If variation in the relative position of the wafer and the support plate occurs, the subsequent wafer treatment is adversely affected.

The present invention has been accomplished in consideration of the above-described problem, and a main object of the present invention is to provide technology for improving the precision of the alignment between a wafer and a support plate in an overlapping device.

Solution to Problem

To solve the above problems, the overlapping device according to the present invention is equipped with an overlapping portion for overlapping a substrate and a support, a port for supporting the substrate, a plurality of imaging unit for imaging the end surface of the substrate and the support before being overlapped, a holding portion for holding the substrate and the support which are imaged by the imaging unit, a center position detecting portion which is configured to detect the respective center positions of the substrate and the support from a plurality of images which the imaging unit images, and carrying unit for carrying the substrate and the support after detecting the center positions from the holding portion to the overlapping portion, and is configured to overlap the substrate and the support such that the center positions of the substrate and the support detected by the center position detecting portion are overlapped with each other, in the overlapping portion.

In addition, the overlapping method according to the present invention includes an imaging step of imaging the end surface of a substrate and support which are held in a holding portion by a plurality of imaging unit, a center position detecting step of detecting the respective center positions of the substrate and the support from a plurality of images imaged in the imaging step, a carrying step of carrying the substrate and the support of which the center positions are detected from the holding portion to the overlapping portion, and an overlapping step of overlapping the substrate and the support such that the detected center positions of the substrate and the support are overlapped with each other, in the overlapping portion.

Advantageous Effects of Invention

According to the present invention, the center positions of the substrate and the support which are held in the holding portion are detected, and then, the substrate and the support are carried from the holding portion to the overlapping portion, and in the overlapping portion, the substrate and the support are overlapped such that the detected center positions of the substrate and the support are overlapped. Due to this, it is possible to improve the precision of the alignment between a wafer and a support plate.

BRIEF DESCRIPTION OF DRAWINGS

FIG. 1 is a top view schematically showing an entire configuration of a bonding system according to an embodiment.

FIG. 2 is a top view schematically showing a configuration of a holding portion according to an embodiment.

FIG. 3(a) is a front view schematically showing a configuration of an overlapping portion according to an embodiment, and FIG. 3(b) is a simplified view of FIG. 3(a).

FIG. 4 is a top view schematically showing a configuration of position adjusting unit according to an embodiment.

FIG. 5 is a top view schematically showing a configuration of a hooking member according to an embodiment.

FIG. 6 is a view showing a configuration of a bonding unit according to an embodiment.

FIG. 7 is a view illustrating operation of an overlapping device according to an embodiment.

DESCRIPTION OF EMBODIMENTS

The overlapping device according to the present invention is equipped with an overlapping portion for overlapping a substrate and a support for supporting the substrate, a plurality of imaging unit for imaging the end surface of the substrate and the support before being overlapped, a holding portion for holding the substrate and the support which are imaged by the imaging unit, a center position detecting portion which is configured to detect the respective center positions of the substrate and the support from a plurality of images which the imaging unit images, and carrying unit for carrying the substrate and the support after detecting the center positions from the holding portion to the overlapping portion, and is configured to overlap the substrate and the support such that the center positions of the substrate and the support detected by the center position detecting portion are overlapped with each other, in the overlapping portion.

In addition, the overlapping method according to the present invention includes an imaging step of imaging the end surface of a substrate and support which are held in a holding portion by a plurality of imaging unit, a center position detecting step of detecting the respective center positions of the substrate and the support from a plurality of images imaged in the imaging step, a carrying step of carrying the substrate and the support of which the center positions are detected from the holding portion to the overlapping portion, and an overlapping step of overlapping the substrate and the support such that the detected center positions of the substrate and the support are overlapped with each other, in the overlapping portion.

Laminate

The overlapping device forms a laminate by overlapping a substrate and a support for supporting the substrate through an adhesive layer which is laminated on at least one of the substrate and the support. That is, the laminate is formed by laminating a substrate, an adhesive layer containing, for example, a thermoplastic resin, and a support plate (support) for supporting the substrate in this order. The adhesive layer may be formed by coating any one of a substrate and a support plate with an adhesive, or attaching an adhesive tape which is coated with an adhesive. In addition, it is possible to bond a substrate and a support plate by setting the formed laminate at a predetermined position of the attaching apparatus using a carrying device, for example, a robot armor the like, and applying pressure force.

Moreover, a forming method and a forming device for forming a laminate, that is, a forming method of an adhesive layer or an adhesive layer forming device are not particularly limited, and various methods and devices can be employed.

In addition, the substrate is subjected to processes such as thinning, carrying, mounting, and the like in a state of being supported (attached) by a support plate. The substrate is not limited to a wafer substrate, and for example, any substrate such as a ceramic substrate, a thin film substrate, a flexible substrate, and the like which are required to be supported by a support plate may be used.

The support plate is a support for supporting a substrate, and is attached to a substrate through an adhesive layer. Therefore, the support plate may have strength necessary to prevent the substrate from being damaged or deformed at the time of processes such as thinning, carrying, and mounting of the substrate, and is desirably the lighter one. From the viewpoints as described above, the support plate is more preferably configured with glass, silicon, an acryl-based resin, or the like.

An adhesive configuring the adhesive layer may include, for example, a thermoplastic resin in which thermal fluidity is improved by heating, as an adhesive material. Examples of the thermoplastic resin include an acryl-based resin, a styrene-based resin, a maleimide-based resin, a hydrocarbon-based resin, and an elastomer resin.

The forming method for an adhesive layer, that is, a coating method for coating a substrate or a support plate with an adhesive, or the forming method for forming an adhesive tape by coating a base material with an adhesive is not particularly limited, and examples of the coating method of an adhesive include a spin coating method, a dipping method, a roller blade method, a doctor blade method, a spraying method, and a slit nozzle method.

Though the thickness of an adhesive layer may be suitably set depending on the type of the substrate and the support plate to be attached and a treatment to be performed on the substrate after attaching, the thickness is preferably in a range of 10 μm to 150 μm, and more preferably in a range of 15 μm to 100 μm.

Moreover, when peeling the support plate from the substrate, the adhesive layer may be dissolved by supplying a solvent to the adhesive layer. As a result, it is possible to separate the substrate and the support plate. At this time, if a through hole penetrating in the thickness direction is formed in the support plate, it is possible to easily supply a solvent to the adhesive layer through the through hole, and thus it is more preferable.

In addition, layers other than the adhesive layer may be further formed between the substrate and the support plate as long as attachment of both is not hindered. For example, a release layer altered by irradiation with light may be formed between the support plate and the adhesive layer. By the formed release layer, it is possible to easily separate the substrate and the support plate by irradiation of light after a process such as thinning, carrying, or mounting of the substrate.

Bonding System

In one embodiment, the overlapping device according to the present invention can be incorporated into the bonding system for bonding a substrate 42 and a support plate 41.

FIG. 1 is a configuration view showing the bonding system 1 in the embodiment, and shows a schematic configuration of the bonding system 1 that is seen from right above. As shown in FIG. 1, the bonding system 1 is configured with a bonding unit 2, a holding portion 3, first external carrying unit 4, and a first external carrying unit track 5. The bonding unit 2 is configured to include an overlapping portion 6 in which pressure can be reduced and an attaching portion 7 in which pressure can be reduced. Among these, the overlapping device according to the embodiment is configured by the holding portion 3 and the overlapping portion 6, and the attaching apparatus according to the embodiment is configured by the attaching portion 7, respectively.

Furthermore, in FIG. 1, a FOUP opener 50 provided in the bonding system 1, a spinner 52 for coating the substrate 42 with an adhesive layer, a baking plate 51 for curing the coated adhesive layer, second external carrying unit 54, and a pass line 53 for delivering the substrate 42 to the first external carrying unit 4 are illustrated.

The external carrying unit 4 has a configuration in which the support plate 41, the substrate 42, and a laminate 40 can be transported, and is configured to be able to transfer the support plate 41, the substrate 42, and the laminate 40 between the external carrying unit 4 and the bonding unit 2. The external carrying unit 4 moves on the external carrying unit track 5. The external carrying unit 4 and the external carrying unit track 5 performing such a function can be prepared by known techniques in the related art.

Holding Portion

FIG. 2 is a view showing a schematic configuration of the holding portion 3. As shown in FIG. 2, the holding portion 3 is equipped with imaging portions (first imaging unit and second imaging unit) 17a and 17b, and a center position detecting portion 19, and is configured to hold the substrate 42 or the support plate 41 before being overlapped (moreover, in FIG. 2, a case of holding the support plate 41 is shown).

The imaging portions 17a and 17b are configured to image each of regions 18a and 18b including the end surface (first end surface and second end surface) different from each other of the substrate 42 or the support plate 41 held in the holding portion 3. For example, the regions 18a and 18b are preferably set on an approximately diagonal line of the substrate 42 or the support plate 41 held in the holding portion 3. The imaging portions 17a and 17b, for example, can be a CCD camera.

The center position detecting portion 19 detects the center position of the substrate 42 or the support plate 41 held in the holding portion 3 based on a plurality of images taken by the imaging portions 17a and 17b. The center position detecting portion 19 may be configured to detect the center position by calculating a virtual circle based on the image of the end surface of a disc. In the detection technology of the center position based on the image of the end surface, a known image processing may be used, and, it is not particularly limited.

Overlapping Portion

FIG. 3(a) is a view showing a schematic configuration of the overlapping portion 6, and FIG. 3(b) is a simplified view of FIG. 3(a). As shown in FIG. 3(a), the overlapping portion 6 is equipped with a lifting and lowering stage (support unit) 21, a position adjusting portion (position adjusting unit) 22, a hooking member 23, a temporary fixing portion (temporary fixing unit) 24, a heater 25, and a pressing portion 26. As shown in FIG. 3(b), the position adjusting portion 22 and the hooking member 23 are configured to move in the horizontal direction, and the lifting and lowering stage 21 and the temporary fixing portion 24 are configured to move in the vertical direction. The support plate 41 and the substrate 42 are separately introduced into the overlapping portion 6.

The lifting and lowering stage 21 is a member for holding the support plate 41, the substrate 42, or a laminate 40 obtained by overlapping these from the bottom surface thereof, and for example, can be a chuck for suction-holding the support plate 41, the substrate 42, or the laminate 40 obtained by overlapping these. The lifting and lowering stage 21 is movable up and down in the vertical direction, and due to this, it is possible to move the support plate 41, the substrate 42, and the laminate 40, which are held, up and down in the vertical direction.

A set surface 21a, which is for the support plate 41 or the like, in the lifting and lowering stage 21 is preferably formed of, for example, a resin such as polytetrafluoroethylene or PEEK so as not to scratch on a set object. In addition, a groove is preferably formed on the set surface 21a. By forming a groove on the set surface 21a, it is possible to prevent gas from remaining between the support plate 41, the substrate 42 and the laminate 40, and the set surface 21a when the inside of the overlapping portion 6 is decompressed.

The position adjusting portion 22 is a member for adjusting the positions in the horizontal direction of the support plate 41 and the substrate 42 to be aligned, for the purpose of alignment. The position adjusting portion 22 is configured to adjust a position in the in-plane direction of at least one of the support plate 41 and the substrate 42 such that the center positions of the support plate 41 and the substrate 42 are overlapped with each other on the basis of the center positions of the support plate 41 and the substrate 42 which are detected by the center position detecting portion 19. For example, as shown in FIG. 4, the position adjusting portion 22 may adjust the center positions of the support plate 41 and the substrate 42 so as to be overlapped with a predetermined central axis O.

In this manner, the position adjusting portion 22 adjusts a position in the in-plane direction of at least one of the support plate 41 and the substrate 42 such that the center positions of the substrate 42 and the support plate 41 which are detected by the center position detecting portion 19 are overlapped with each other. Due to this, in overlapping portion 6, it is possible to overlap the center positions of the substrate and the support which are detected by the center position detecting portion 19.

Moreover, the specific mechanism of the position adjusting portion 22 is not particularly limited as long as it is possible to suitably adjust the positions in the horizontal direction of the support plate 41 and the substrate 42, that is, it is possible to move the support plate 41 and the substrate 42 to the desired horizontal position. The position adjusting portion 22 in the embodiment, as shown in FIG. 4, is configured to adjust the positions in the horizontal direction of the support plate 41 and the substrate 42 by being pressed by the pressing portions 26a to 26d and coming into contact with the support plate 41 or the substrate 42. The pressing portions 26a to 26d can be configured, for example, with a stepping motor, an air cylinder, and the like.

In addition, as shown in FIGS. 3(a) and 3(b), the position which the position adjusting portion 22 comes into contact with the support plate 41 or the substrate 42, as an example, has two steps. Due to this, for example, it is possible to treat the substrate 42 or the like having two different sizes.

The hooking member 23 is a member for holding the support plate 41 (in a case of performing alignment of the substrate 42 first, the substrate 42) that has been aligned until overlapping is performed without changing the horizontal position of the support plate 41. FIG. 5 is a view of the hooking member 23 seen from the upper surface side. The hooking member 23 stably holds the support plate 41 by supporting a part of the peripheral portion of the support plate 41 from the lower side. The hooking member 23 is movable in the horizontal direction. When the support plate 41 is transported to the top portion of the hooking member 23 by being set on the lifting and lowering stage 21, the hooking member 23 is moved to a position not overlapping at all with the support plate 41. In the specification, this state is referred to as "the hooking member 23 is at an "unhooking position"". After the support plate 41 is transported to the spacer insertion position, the hooking member 23 is returned to the position overlapping with the support plate 41 such that the support plate 41 can be supported by hooking member 23. In the specification, this state is referred to as "the hooking member 23 is at an "inserted position"". FIG. 5 shows the state in which the hooking member 23 is at the "inserted position". The width $d_3$ of the overlap between the respective members for supporting the support plate 41 of the hooking member 23 and the support plate 41 when the hooking member 23 is at the inserted position, not limitingly, may be about 1 mm to 5 mm from the periphery to the inside of the support plate 41. 5 mm is preferable. In addition, as the size of the hooking member 23, for example, the lateral width $d_4$ may be 5 mm, however, the invention is not limited thereto.

The material of the hooking member 23 is not particularly limited, and for example, those obtained by chamfering stainless steel (SUS) and resin-coating with polytetrafluoroethylene can be used.

The temporary fixing portion 24 is a member for temporarily fixing the support plate 41 to the substrate 42 by pressing a part of region of the support plate 41 overlapped on the substrate 42 toward the substrate 42 and heating the part when the support plate 41 and the substrate 42 are overlapped. That is, by performing pressing and heating to a part of region, a part of the adhesive layer is soften which is sandwiched between the support plate 41 and the substrate 42. Thereafter, by performing re-cooling, it is possible to temporarily fix the support plate 41 and the substrate 42.

In this manner, according to the embodiment, it is possible to temporarily fix the support plate 41 and the substrate 42, and thus, it is possible to successfully prevent occurrence of deviation at the relative position between the substrate 42 and the support plate 41 when the overlapped laminate 40 is carried to the attaching portion 7.

The temporary fixing portion 24 is configured to sandwich the support plate 41 and the substrate 42 together with the lifting and lowering stage 21, and the area of the contact surface 24a with respect to the support plate 41 of the temporary fixing portion 24, which is not particularly limited, is suitably set in view of temporary fixing strength of the support plate 41 and the substrate 42 or occurrence of voids or the like between the support plate 41 and the substrate 42.

Moreover, the region on the support plate 41 with which the contact surface 24a comes into contact is preferably the center portion of the support plate 41. Due to this, it is possible to temporarily fix the support plate 41 and the substrate 42 in a well-balanced manner.

In addition, the temporary fixing portion 24 is equipped with the heater (heating unit) 25 for heating the contact surface 24a. In addition, the material of the temporary fixing portion 24, which is not particularly limited, can be configured of aluminum or the like having good thermal conductivity. In addition, the temporary fixing portion 24 is driven, for example, by a stepping motor, and pressure force on the support plate 41 can be controlled by the torque applied to the stepping motor.

In addition, the temporary fixing portion 24 is provided vertically above the hooking member 23, and is configured to be able to move vertically. The state in which the temporary fixing portion 24 is not moved downward, and due to this, the temporary fixing portion 24 is at a position not in contact with the support plate 41 which is held by the hooking member 23, in the specification, is referred as "the temporary fixing portion 24 is at a "standby position"". In contrast, the state in which the temporary fixing portion 24 is moved downward, and as a result, the temporary fixing portion 24 is at a position pressing the surface of the support plate 41 which is held by the hooking member 23, in the specification, is referred as "the temporary fixing portion 24 is at a "joining position"". The temporary fixing portion 24 is provided so as to come into contact with the center portion of the surface of the support plate 41 when the temporary fixing portion 24 is at the joining position.

Attaching Portion

The attaching portion 7 has bonding unit for bonding the substrate 42 and the support plate 41 overlapped by performing alignment. As the bonding unit, a configuration in which the substrate 42 and the support plate 41 are bonded by thermal compression through an adhesive layer is possible. For example, a configuration in which press plates are provided at an upper portion and a lower portion of the inside of the attaching portion 7, and the laminate 40 before joining is sandwiched between the upper press plate and lower press plate is possible.

Internal Carrying Unit

The overlapping portion 6 and the attaching portion 7 can have a configuration in which a wall partitioning the inside of one treatment chamber into two treatment chambers is provided. In addition, the overlapping portion 6 and the attaching portion 7 may have a configuration in which the overlapping portion 6 and the attaching portion 7 are in contact with each other without a gap at each side surface thereof. At the boundary of the overlapping portion 6 and the attaching portion 7, a gate 8 for transferring the laminate 40 between the overlapping portion 6 and the attaching portion 7 is provided. Opening and closing of the gate 8 are controlled by a shutter. In addition, in the overlapping portion 6, an openable and closable transferring window 9 for transferring the support plate 41, the substrate 42, and the laminate 40 between the bonding unit 2 and the external carrying unit 4 is provided. In the overlapping portion 6 and the attaching portion 7, known decompressing unit is respectively provided (not shown), and the state of the internal pressure of each chamber can be independently controlled.

Since the attaching portion 7 has a decompressible configuration, it is possible to bond the substrate 42 and the support plate 41 through an adhesive layer under a reduced pressure atmosphere. By pressing the substrate 42 against the adhesive layer in a reduced pressure atmosphere, in a state in which air in a recess of the uneven pattern of the surface of the substrate 42 is not present, the adhesive layer can be made to penetrate into the recess, and thus, it is possible to more reliably prevent occurrence of bubbles between the adhesive layer and the substrate 42.

The gate 8 is formed such that the laminate 40 which has been aligned can be moved from the overlapping portion 6 to the attaching portion 7, and the laminate 40 after joining can be moved from the attaching portion 7 to the overlapping portion 6 in a state in which the shutter is open. By opening the shutter in a state where both the overlapping portion 6 and the attaching portion 7 are decompressed, the gate 8 has a configuration in which the laminate 40 before joining can be moved from the overlapping portion 6 to the attaching portion 7 under decompression.

In the bonding unit 2, an internal carrying unit (10 in FIG. 6) for transferring the laminate 40 between the overlapping portion 6 and the attaching portion 7 through the gate 8 is provided.

FIG. 6 is a configuration view of the internal configuration of the bonding unit 2 including the internal carrying unit 10 seen from the top. The internal carrying unit 10 is not particularly limited in a specific mechanism as long as it has a configuration in which the laminate 40 can be moved between the overlapping portion 6 and the attaching portion 7. In the embodiment, as shown in FIG. 6, the internal carrying unit 10 is configured with an internal carrying arm 11 and an arm pivot 12. The internal carrying unit 10 has a mechanism for moving the laminate 40 by revolution in which the arm pivot 12 of the internal carrying arm 11 capable of supporting the laminate 40 from the lower surface is the revolution center. Although details will be described below, in the embodiment, two internal carrying unit 10 which have a same revolution pivot are provided. Though the arm pivot 12 is provided on the side of the overlapping portion 6, the arm pivot 12 may be provided on the side of the attaching portion 7. From the viewpoint of being able to shorten the stroke of transfer between the overlapping portion 6 and the external carrying unit 4, the arm pivot 12 is preferably formed on the side close to the side surface on which the transferring window 9 is formed. The two-dot chain line indicated by "B" in FIG. 6 represents the standby position of the internal carrying arm 11, and the two-dot chain line indicated by "C" represents the position of the internal carrying arm 11 in the attaching portion 7 (attaching portion transfer position).

The revolving speed of the internal carrying arm 11 can be set according to the situation. Therefore, when the internal carrying arm 11 holds the laminate 40, it is possible to make the internal carrying arm 11 revolve at a low speed, and when the internal carrying arm 11 does not hold the laminate 40, it is possible to make the internal carrying arm 11 revolve at a high speed. In addition, it is possible to control the acceleration and deceleration such that rising and stopping of the revolution of the internal carrying arm 11 become smooth.

As shown in FIG. 6, the gate 8 has an opening with a width with which the revolving internal carrying arm 11 can transport the laminate 40 to an attaching portion transfer position C after passing through the gate 8 in a state in which the shutter is open. Known means in the related art can be used to open and close the gate 8, and for example, it is possible to apply a gate valve structure.

Operation of Overlapping Device

Subsequently, operation (overlapping method according to the embodiment) of the overlapping device (holding portion 3 and overlapping portion 6) according to the embodiment will be briefly described.

FIG. 7 is a view illustrating operation of the overlapping device according to an embodiment in reference to the internal state of the overlapping portion 6. Moreover, for convenience of illustration, in the same manner as in FIG. 3(b), each member for holding or controlling the position adjusting portion 22, the hooking member 23, and the temporary fixing portion 24 is not shown in FIG. 7.

1. Introduction of Support Plate 41 Into Holding Portion 3

The support plate 41 is introduced into the holding portion 3 using the external carrying unit 4. Then, the center position detecting portion 19 detects the center position of the support plate 41. In detail, first, the imaging portions 17a and 17b image the end surface of the support plate 41 held in the holding portion 3 (imaging step). Then, the center position detecting portion 19 detects the center position of the support plate 41 held in the holding portion 3 based on a plurality of images taken by the imaging portions 17a and 17b (center position detecting step).

2. Introduction of Support Plate 41 Into Overlapping Portion 6

Using the external carrying unit 4, the support plate 41 is introduced into the inside of the overlapping portion 6 through the transferring window 9, and is set on the lifting and lowering stage 21 (carrying step, refer to FIG. 7(a)). Moreover, at this time, the hooking member 23 is preferably at an unhooking position, and the temporary fixing portion 24 is preferably at a standby position.

3. Alignment of Support Plate 41

Next, the lifting and lowering stage 21 on which the support plate 41 is mounted is moved to a position where the position adjusting portion 22 is present. Then, the position in the horizontal direction of the support plate 41 is adjusted by the position adjusting portion 22 such that the center position of the support plate 41 detected in (1) is overlapped with a predetermined central axis (overlapping step, refer to FIG. 7(b)).

4. Introduction of Hooking Member 23—Transfer of Support Plate 41

After alignment of the support plate 41 ends, the lifting and lowering stage 21 on which the support plate 41 is mounted is raised to a position where the hooking member 23 is inserted. Then, the hooking member 23 is moved to the inserted position (refer to FIG. 7(c)). As a result, being held by the hooking member 23 without changing the position in the horizontal direction of the support plate 41 of which alignment has ended, the lifting and lowering stage 21 can be lowered again.

5. Introduction of Support Plate 41 Into Holding Portion 3

Using the external carrying unit 4, the substrate 42 is introduced into the holding portion 3. Then, the center position detecting portion 19 detects the center position of the substrate 42. In detail, first, the imaging portions 17a and 17b image the end surface of the substrate 42 held in the holding portion 3 (imaging step). Then, the center position detecting portion 19 detects the center position of the substrate 42 held in the holding portion 3 based on a plurality of images taken by the imaging portions 17a and 17b (center position detecting step).

6. Introduction of Substrate 42

Using the external carrying unit 4, the substrate 42 is introduced into the inside of the overlapping portion 6 through the transferring window 9, and is arranged on the lifting and lowering stage 21 (carrying step, refer to FIG. 7(d)). After the substrate 42 is introduced into the inside of the overlapping portion 6, the transferring window 9 is closed, and decompression of the overlapping portion 6 starts. Decompression of the overlapping portion 6 may be performed such that the decompressed state of the overlapping portion 6 and the decompressed state of the attaching portion 7 at the time when temporary fixing ends become almost the same state as each other. The pressure is preferably 10 Pa or less.

7. Alignment of Substrate 42

Next, the lifting and lowering stage 21 on which the substrate 42 is mounted is moved to a position where the position adjusting portion 22 is present. Then, the position in the horizontal direction of the substrate 42 is adjusted by the position adjusting portion 22 such that the center position of the substrate 42 detected in (5) is overlapped with a predetermined central axis (overlapping step, refer to FIG. 7(e)).

8. Temporary Fixing and Unhooking of Hooking Member

The lifting and lowering stage 21 on which the substrate 42 of which alignment has ended is mounted is raised to a position where the lifting and lowering stage 21 is overlapped with the support plate 41. After the lifting and lowering stage 21 reaches the position, the temporary fixing portion 24 is moved onto the support plate 41. Thus, the contact surface 24a of the temporary fixing portion 24 comes into contact with the surface of the support plate 41, and due to this, the surface of the support plate 41 is in a pressed state (overlapping step, refer to FIG. 7(f)). At the same time, the contact surface 24a is heated by the heater 25. As a result, the adhesive layer between the substrate 42 and the support plate 41 is thermally flow, and temporary fixing is performed.

Moreover, the temperature of the contact surface 24a, for example, is preferably raised to the glass transition temperature (Tg) of the thermoplastic resin which is an adhesive material of the adhesive layer or higher, and more preferably raised to the glass transition temperature (Tg) or higher. By heating the adhesive layer to the glass transition temperature of the thermoplastic resin or higher, thermal fluidity of the adhesive layer is improved, and the adhesive layer can be easily deformed. Though it depends on the material of the adhesive layer, that is, the thermoplastic resin which is an adhesive material, the temperature of the contact surface 24a is preferably 23° C. to 300° C., and the heating time, that is, the pressing time, is preferably 3 seconds to 300 seconds, and more preferably 5 seconds to 180 seconds.

In addition, after the support plate 41 is pressed to the substrate 42 by the temporary fixing portion 24, the hooking member 23 is returned to the unhooking position. Thus, at the entire portion where the support plate 41 and the substrate 42 are overlapped, the support plate 41 and the substrate 42 are in a overlapped state (overlapping step, refer to FIG. 7(g)).

9. End of Overlap

After the support plate 41 and the substrate 42 are overlapped, the temporary fixing portion 24 is returned to the standby position. Next, the lifting and lowering stage 21 on which the laminate 40 obtained by overlapping the support plate 41 and the substrate 42 is mounted is lowered. By the above, overlap ends (refer to FIG. 7(h)).

10. Carrying of Laminate 40

The shutter of the gate 8 is opened, the internal carrying unit 10 is moved to the overlapping portion 6, and the laminate 40 is held (refer to FIG. 7(b)). Then, the internal carrying unit 10 carries the laminate 40 to the attaching portion 7 (refer to FIG. 7(b)).

As described above, in the overlapping device according to the embodiment, the substrate 42 and the support plate 41 can be overlapped such that the center positions of the substrate 42 and the support plate 41 which are detected by the center position detecting portion 19 are overlapped with each other. As a result, even in a case where there is variation in size of the support plate 41, it is possible to prevent occurrence of variation in the relative position between the substrate 42 and the support plate 41, unlike in a case where the outer diameters of the substrate 42 and the support plate 41 are matched. Specifically, in the methods in the related art, deviation of about 100 μm occurs, however, in the case of using this embodiment, it is possible to suppress the deviation to about 50 μm.

The invention is not limited to the above-described embodiments and various modifications are possible within the scope shown in the claims. That is, embodiments obtained by combining technical means suitably modified within the scope shown in the claims also are included in the technical scope of the present invention.

INDUSTRIAL APPLICABILITY

Since it is possible to improve the bonding precision of a substrate and a support plate in a vacuum by the present invention, the present invention can be widely used in the field of production of industrial products.

REFERENCE SIGNS LIST

1 Bonding system
2 Bonding unit
3 Holding portion
4 External carrying unit (carrying unit)
5 External carrying unit track
6 Overlapping portion (first treatment chamber)
7 Attaching portion (second treatment chamber)
8 Gate
9 Transferring window
10 Internal carrying unit
11 Internal carrying arm
12 Arm pivot
17a, 17b Imaging portion (first imaging unit, second imaging unit)
18a, 18b Imaging region
19 Center position detecting portion
21 Lifting and lowering stage (support unit)
22 Position adjusting portion (position adjusting unit)
23 Hooking member
24 Temporary fixing portion (temporary fixing unit)
25 Heater (heating unit)
26 Pressing portion
40 Laminate
41 Support plate (support)
42 Substrate 50 FOUP opener
51 Baking plate
52 Spinner
53 Pass line
54 Second external carrying unit

What is claimed is:

1. An overlapping device, comprising:
an overlapping position at which a substrate and a support for supporting the substrate are overlapped;
a plurality of cameras imaging an end surface of the substrate and the support before being overlapped at a holding position located completely outside the overlapping position;
an image processor detecting respective center positions of the substrate and the support from a plurality of images of the end surface of the substrate and the support imaged by the plurality of cameras; and
a rotatable arm attached to a pivot point carrying the substrate and the support from the holding position to the overlapping position; and
a moveable support with a flange adapted to adjust a position in an in-plane direction of at least one of the substrate and the support at the overlapping position by overlapping the respective center positions of the substrate and the support with a predetermined central axis, such that the respective center positions of the substrate and the support detected by the image processor are overlapped with each other.

2. The overlapping device according to claim 1, wherein the cameras have a first camera imaging a first end surface of the substrate and the support and a second camera imaging a second end surface in a position different from the first end surface of the substrate and the support.

3. The overlapping device according to claim 1, wherein an adhesive layer is laminated on at least one of the substrate and the support, and wherein the overlapping position overlaps the substrate and the support through the adhesive layer.

4. The overlapping device according to claim 1, wherein the overlapping position has a supporter of the substrate and the support hook, and
wherein one of the substrate and the support is overlapped onto the other of the substrate supported by the supporter and the support such that the center positions of the substrate and the support are overlapped with each other.

5. An overlapping method, comprising:
imaging the end surface of a substrate and support by a plurality of cameras before being overlapped which are held in a holding position;
detecting respective center positions of the substrate and the support with an image processor from a plurality of images imaged by the plurality of cameras;
carrying the substrate and the support of which the center positions are detected from the holding position to an overlapping position completely outside the holding position; and
overlapping the center positions of the substrate and the support detected by the image processor in the overlapping position by adjusting,
at least one of the substrate and the support in an in-plane direction after the substrate and the support are carried to the overlapping position by overlapping the respective center positions of the substrate and the support with a predetermined central axis, such that the respective center positions of the substrate and the support are overlapped with each other.

6. The overlapping device according to claim 4, wherein:
the supporter has a set surface for one of the substrate and the support; and
a groove is formed on the set surface.

* * * * *